United States Patent
Fujihara (10) Patent No.: US 8,492,904 B2
(45) Date of Patent: Jul. 23, 2013

(54) SEMICONDUCTOR DEVICE AND MANUFACTURING METHOD OF THE SAME

(75) Inventor: Akira Fujihara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 260 days.

(21) Appl. No.: 12/762,697

(22) Filed: Apr. 19, 2010

(65) Prior Publication Data

US 2010/0270687 A1 Oct. 28, 2010

(30) Foreign Application Priority Data

Apr. 24, 2009 (JP) ................................. 2009-106207

(51) Int. Cl.
- *H01L 23/522* (2006.01)
- *H01L 21/764* (2006.01)
- *H01L 23/535* (2006.01)
- *H01L 21/768* (2006.01)

(52) U.S. Cl.
USPC ................... 257/776; 257/522; 257/E23.143; 257/E21.581; 438/619; 438/666

(58) Field of Classification Search
USPC ... 257/776, 522, E23.143, E21.581; 438/619, 438/666
See application file for complete search history.

(56) References Cited

U.S. PATENT DOCUMENTS

| | | | | |
|---|---|---|---|---|
| 6,249,013 B1 * | 6/2001 | Hirose | ........................... | 257/208 |
| 6,618,287 B2 * | 9/2003 | Elmhurst | ................. | 365/185.11 |
| 7,317,227 B2 | 1/2008 | Shiraishi et al. | | |
| 7,781,837 B2 * | 8/2010 | Seko et al. | ..................... | 257/347 |
| 8,058,960 B2 * | 11/2011 | Hebert et al. | ................. | 336/200 |
| 2004/0219721 A1 * | 11/2004 | Shiraishi et al. | .............. | 438/149 |

FOREIGN PATENT DOCUMENTS

| | | |
|---|---|---|
| JP | 61296798 | * 12/1986 |
| JP | 10-012722 | 1/1998 |
| JP | 10012722 | * 1/1998 |
| JP | 11-186381 | 7/1999 |

OTHER PUBLICATIONS

Taiwanese Search Report dated Jan. 9, 2013 in corresponding Taiwanese Patent Application No. 099112524 with English translation of the Taiwanese Search Report.
Chinese Official Action—201010166124.9—Apr. 22, 2013.

* cited by examiner

*Primary Examiner* — Matthew Reames
*Assistant Examiner* — Benjamin Tzu-Hung Liu
(74) *Attorney, Agent, or Firm* — Young & Thompson (57) ABSTRACT

One aspect of the present invention is a semiconductor device including: a semiconductor substrate; a first wiring that is formed on the semiconductor substrate; a second wiring that is formed to cross over the first wiring with a space interposed therebetween at a cross portion in which the first wiring and the second wiring cross each other; a protective film that is formed on the semiconductor substrate to cover at least a part of the first wiring, the part being located under the second wiring in the cross portion; and an insulator film that is formed in an island shape on the protective film under the second wiring in the cross portion to be located between edges of the protective film and to cover the first wiring in the cross portion.

23 Claims, 9 Drawing Sheets

SEMICONDUCTOR DEVICE AND MANUFACTURING METHOD OF THE SAME

INCORPORATION BY REFERENCE

This application is based upon and claims the benefit of priority from Japanese patent application No. 2009-106207, filed on Apr. 24, 2009, the disclosure of which is incorporated herein in its entirety by reference.

BACKGROUND

1. Field of the Invention

The present invention relates to a semiconductor device, especially to a semiconductor device having a cross-wiring portion in which wirings cross each other.

2. Description of Related Art

When a transistor and an integrated circuit including the transistor operate in a frequency band higher than 10 GHz, it is necessary to reduce a parasitic capacitance around a gate electrode as much as possible in order to ensure a desired performance such as a characteristic or gain in the transistor.

In the transistor used in the high frequency band as described above, especially a transistor using a compound semiconductor device such as GaAs, an oxide film and a nitride film are formed as protective films to stabilize the operation of the transistor. However, the protective films such as the oxide film and the nitride film are required to have a thickness equal to or less than 0.2 um to reduce the parasitic capacitance, and an interlayer film is generally not applied. In the transistor and the integrated circuit as describe above, a technique is widely used in which a cross-wiring portion is not supported by the interlayer film and wirings are separated with an air interposed therebetween. This structure is called an air-bridge structure.

The air-bridge structure has a problem in that an upper layered wiring is deformed due to a thermal stress, mechanical vibration between the wiring layers, and an external force applied to the wiring structure during manufacturing processes, thereby contacting with a lover layered wiring. Japanese Unexamined Patent Application Publication Nos. 11-186381 and 10-12722 disclose a semiconductor device having a structure which prevents the wirings from contacting with each other due to deformation of an upper layered wiring.

Figure 9:
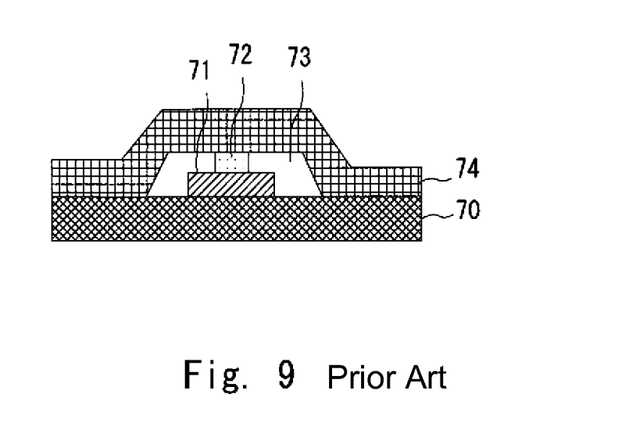
FIG. 9 is a diagram showing a cross-wiring portion of a semiconductor device disclosed in Japanese Unexamined Patent Application Publication No. 11-186381.

FIG. 9 is a diagram showing a configuration of the semiconductor device disclosed in Japanese Unexamined Patent Application Publication No. 11-186381. In the semiconductor device disclosed in Japanese Unexamined Patent Application Publication No. 11-186381, a lower layered wiring 71 extending in the longitudinal direction of the drawing sheet is formed on a semiconductor substrate 70. An upper layered wiring 74 crossing the lower layered wiring 71 is formed to straddle the lower layered wiring 71 with a space 73 interposed therebetween. Further, a supporting column 72 of an insulator film is formed on the lower layered wiring 71 to prevent a short from occurring due to a contact between the upper layered wiring 74 and the lower layered wiring 71.

However, in the semiconductor device disclosed in Japanese Unexamined Patent Application Publication No. 11-186381, the supporting column 72 partially supports the upper and lower layered wirings but it is insufficient to prevent a short from occurring. Specifically, a wafer surface comes into contact with the supporting column 72 in a polishing process for a rear surface and a pelletizing process executed after the air-bridge structure is formed. When an external force is applied to the semiconductor device in the above processes, the upper layered wiring 74 positioned in an area where the supporting column 72 is not formed is pressed, thereby occasionally causing a short due to the contact between the upper layered wiring 74 and the lower layered wiring 71.

Further, even if the short does not occur, a capacitance between the wirings becomes larger, thereby causing a phase of the transistor to deviate from the designed phase when the distance between the wirings is reduced to around 0.1 um. Therefore, a phase matching condition in the design stage cannot be satisfied. Further, because an amount of deformation of the upper layered wiring caused by the above factors varies to a large extent, an amount of change of the phase also varies to a large extent. As a result, a desired performance cannot be obtained and the yield of a product decreases.

Figure 10:
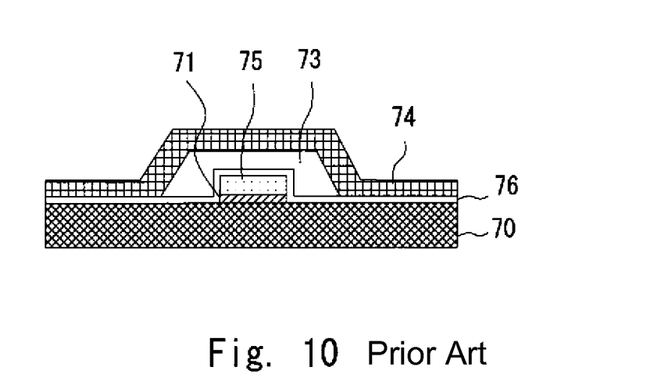
FIG. 10 is a diagram showing a cross-wiring portion of a semiconductor device disclosed in Japanese Unexamined Patent Application Publication No. 10-12722.

On the other hand, as shown in FIG. 10 Japanese Unexamined Patent Application Publication No. 10-12722 discloses a technique in which an insulator film 75 with a large thickness is formed on the lower layered wiring 71 to ensure a distance between the wirings, and an insulator film 76 with a small thickness is formed on the lower layered wiring 71 and the semiconductor substrate 70 to prevent the short from occurring due to the contact between the upper layered wiring 74 and the lower layered wiring 71.

SUMMARY

The present inventor has found the following problem. In the semiconductor device disclosed in Japanese Unexamined Patent Application Publication No. 10-12722, when the insulator film 75 formed on the lower layered wiring 71 is made by a patterning process in which the insulator film 75 is etched with the same profile as the lower layered wiring 71 after a depositing process in which insulating material is deposited by CVD (Chemical Vapor Deposition), for example, the lower layered wiring 71 is damaged during etching. Therefore, there is a problem that a desired performance cannot be obtained.

A first exemplary aspect of the present invention is a semiconductor device including: a semiconductor substrate; a first wiring that is formed on the semiconductor substrate; a second wiring that is formed to cross the first wiring with a space interposed therebetween at a cross portion in which the first wiring and the second wiring cross each other; a protective film that is formed on the semiconductor substrate to cover at least a part of the first wiring, the part being located under the second wiring in the cross portion; and an insulator film that is formed in an island shape on the protective film under the second wiring in the cross portion to be located between edges of the protective film and to cover the first wiring in the cross portion.

As described above, in the semiconductor device including the air-bridge structure, the insulator film having an island shape is formed on the protective film under the second wiring to be located between edges of the protective film and to cover the first wiring in the cross portion. Therefore, the protective film protects the first wiring of the lower layer under the insulator film and prevents the first wiring from being damaged at the time of forming the insulator film.

A second exemplary aspect of the present invention is a manufacturing method of a semiconductor device, including: forming a first wiring on a semiconductor substrate; forming a second wiring to cross the first wiring with a space interposed therebetween at a cross portion in which the first wiring and the second wiring cross each other; forming a protective film on the semiconductor substrate to cover at least a part of the first wiring, the part being located under the second wiring in the cross portion; and forming an insulator film in an island shape on the protective film under the second wiring in the cross portion to be located between edges of the protective film and to cover the first wiring in the cross portion.

As described above, in the semiconductor device including the air-bridge structure, the insulator film having an island shape is formed on the protective film under the second wiring to be located between edges of the protective film and to cover the first wiring in the cross portion. Therefore, the protect film protects the first wiring of the lower layer under the insulator film and prevents the first wiring from being damaged at the time of forming the insulator film.

BRIEF DESCRIPTION OF THE DRAWINGS

The above and other exemplary aspects, advantages and features will be more apparent Prom the following description of certain exemplary embodiments taken in conjunction with the accompanying drawings, in which.

DETAILED DESCRIPTION OF THE EXEMPLARY EMBODIMENTS

Hereinafter, referring to attached drawings, a semiconductor device and a manufacturing process of the same according to preferable embodiments of the present invention will described.

First Exemplary Embodiment

Figure 1:
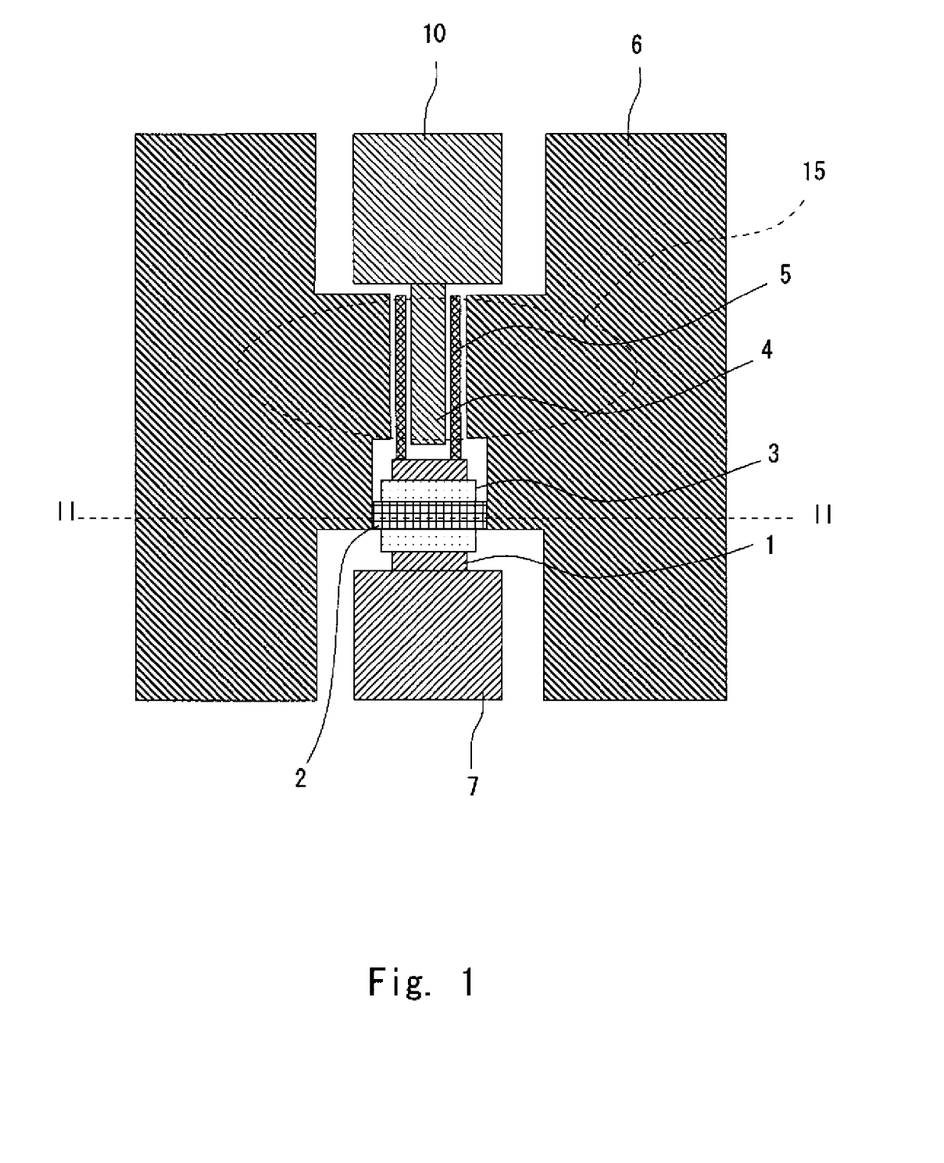
FIG. 1 is a plan view showing an exemplary configuration of a semiconductor device according to a first exemplary embodiment of the present invention.
Figure 2:
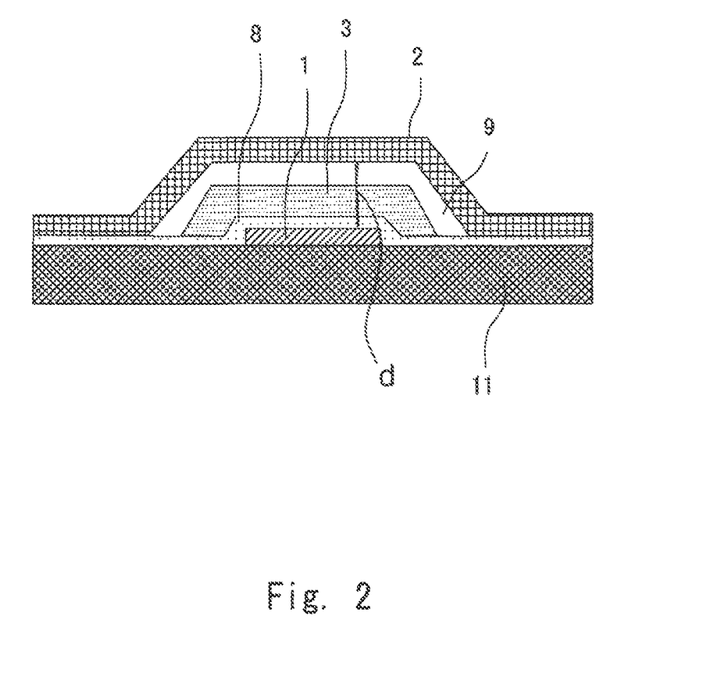
FIG. 2 is a cross sectional view taken along line II-II in FIG. 1.

FIG. 1 is a plan view showing a portion of a semiconductor device according to a first exemplary embodiment of the present invention, and FIG. 2 is a cross sectional view taken along line II-II in FIG. 1. In the first exemplary embodiment, a gate electrode is configured as a first wiring of a lower layered wiring and a source electrode is configured as second wiring of an upper layered wiring. Hereinafter, referring to FIGS. 1 and 2, a configuration of the semiconductor device according to the first exemplary embodiment will be described.

As shown in FIG. 1, the semiconductor device includes a gate electrode pad 7, a drain electrode pad 10, and source electrodes 6. The drain electrode pad 10 is connected to a drain electrode 4. The drain electrode 4 is formed to extend in longitudinal direction of the drawing sheet. The source electrodes 6 are located to sandwich the drain electrode 4. Both sides of the source electrodes 6 are connected to each other by a second wiring 2 and are supplied with the same voltage. The insulator film 3 is formed in an island shape on the protective film under the second wiring 2 in the cross portion to be located between edges of the protective film and to cover the first wiring in the cross portion.

The gate electrode pad 7 is connected to gate electrodes 5 with a first wiring 1 interposed therebetween. The first wiring 1 is formed to extend in the longitudinal direction of the drawing sheet. One of the gate electrode 5 is formed between the source electrode 6 located on the left side in FIG. 1 and the drain electrode 4, and the other of the gate electrode 5 is formed between the source electrode 6 located on the right side and the drain electrode 4. The gate electrodes 5 are located to sandwich the drain electrode 4 and are supplied with the same voltage through the first wiring 1.

The first wiring 1 extending in the longitudinal direction of the drawing sheet and the second wiring 2 extending in the horizontal direction of the drawing sheet cross each other at a cross portion. The second wiring 2 is formed at the cross portion to straddle the first wiring 1 with a predetermined space interposed therebetween. That is, the semiconductor device according to this exemplary embodiment has an air-bridge structure in which the wirings cross each other with a space interposed therebetween. Hereinafter, an area where the first wiring 1 and the second wiring 2 cross each other in the plane view is called "a cross portion". In the cross portion, an insulator film 3 having an island shape is formed between the first wiring 1 and the second wiring 2 in order to cover the first wiring 1. The insulator film 3 is formed on an upper surface and side surfaces of the first wiring 1 with an approximately uniform thickness.

Using a sectional view shown in FIG. 2, the present exemplary embodiment will be explained. As described above, in the cross portion with the first wiring 1 formed on a semiconductor substrate 11, the second wiring 2 is formed to straddle the first wiring 1 with a space 9 interposed therebetween.

Under the second wiring 2 in the cross portion, that is, inside of the cross portion, a protective film 8 is formed on the semiconductor substrate 11 to cover at least a part of the first wiring 1. An illustration of the protective film 8 is omitted in FIG. 1. The protective film 8 is formed to protect the semiconductor element such as a transistor or the like which is formed on the semiconductor substrate 11. The protective film 8 may be made of a SiN film. It is preferred that a thickness of the protective film 8 be equal to or less than 0.2 um to decrease a capacitance value of a parasitic capacitor made up of the first wiring 1, the protective film 8, and the second wiring 2. For example, the thickness of the protective film 8 is designed to be 0.1 um.

On the protective film 8 under the second wiring 2 in the cross portion, the insulator film 3 having an island shape is formed by patterning to be located between edges of the protective film 8 and to cover the first wiring 1 in the cross portion. That is, the protective film 8, the insulator film 3 and the space 9 are located between the first wiring 1 and the second wiring 2.

It is preferred that a distance d between the first wiring and the second wiring 2 be equal to or more than 0.1 um to ensure a sufficient space. In this explanation, it is assumed that the distance d between the wirings is equal to or more than 0.2 um, which is equivalent to the thickness of the insulator film 3, to ensure a predetermined space. However, the distance d between the wirings is not limited thereto, and can be designed to be any distance according the thickness of the insulator film 3.

The insulator film 3 is made of a low dielectric film. It is preferred that a relative permittivity ∈r of the insulator film 3 be equal to or less than 3.5 to decrease a capacitance value of a parasitic capacitor made up of the first wiring 1, the insulator film 3, and the second wiring 2. It is preferred that the thickness of the insulator film 3 be formed to be thicker than the thickness of the protective film 8. It is preferred that the thickness of the insulator film 3 be equal to or more than 0.5 um to sufficiently ensure the distance between the wirings and to decrease a capacitance between wirings. For example, the thickness of the insulator film 3 is designed to be less than 0.2 um.

The insulator film 3 covers the first wiring 1 and extends outwardly about several um from an edge of the cross portion, and is not applied to a transistor portion 15. This configuration is employed to prevent a false operation of the transistor from being caused by the parasitic capacitance or the like made up of the first wiring 1, the insulator film 3, and the second wiring 2. It is preferred that the insulator film 3 be formed of spin-coating material formed by spin-coating process or a printed material formed by a printing process. For example, the insulator film 3 may be made of benzocyclobutene (BCB) having relative permittivity ∈r=2.7. Note, the insulator film 3 does not necessarily have a photosensitivity.

Figure 3A:
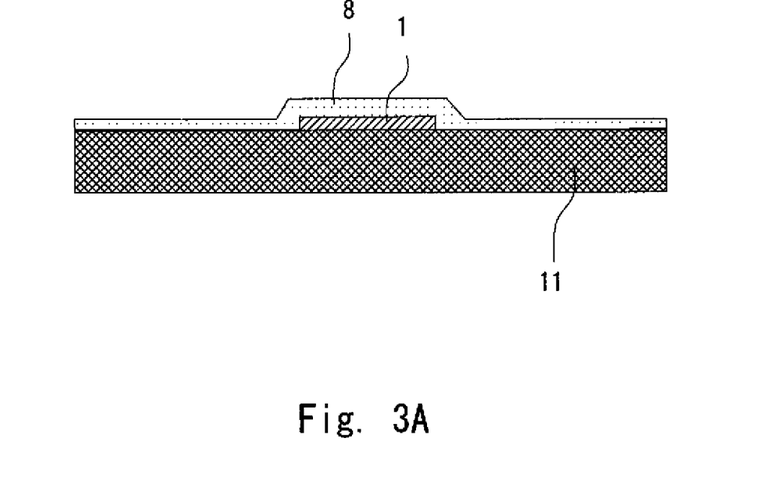
FIGS. 3A and 3B are diagrams each showing a manufacturing process of the semiconductor device according to the first exemplary embodiment.

Next, a manufacturing method of the semiconductor device configured as described above will be described. FIGS. 3A, 3B, 4A, and 4B are diagrams showing the manufacturing process of the semiconductor device according to the first exemplary embodiment of the present invention. As shown in FIG. 3A, after the source electrode 6, the drain electrode 4, the gate electrode 5, and the first wiring 1 of the transistor (not shown) formed on the semiconductor substrate 11 are formed, the protective film 8 of the transistor portion 15 is entirely applied.

Figure 3B:
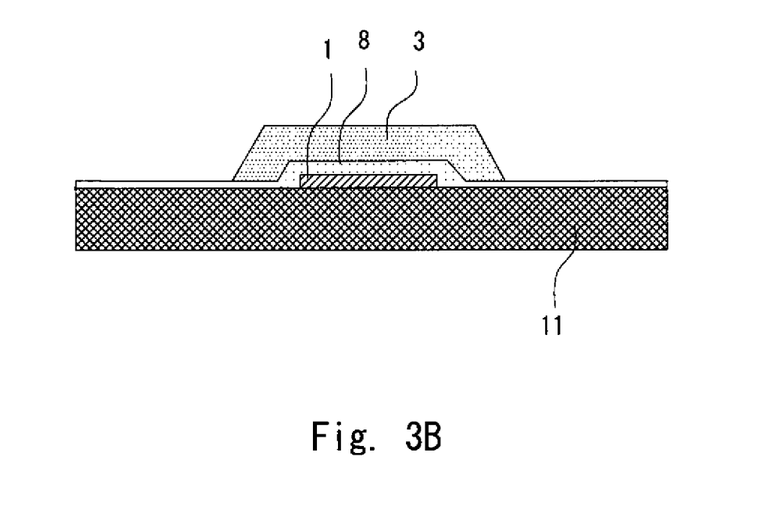

As shown in FIG. 3B, after the BCB having photosensitivity is applied as a low dielectric film, and the insulator film 3 is formed above the first wiring 1 in the cross portion by an exposure process, a development process, and a cure process so that the insulator film 3 has a thickness of 2.0 um. At this time, a patterning process is performed so that the insulator film 3 entirely covers the first wiring 1 in the cross portion and extends outwardly around several um from the first wiring 1. In the other words, the insulator film 3 is formed in an island shape on the protective film 8 in the cross portion by the patterning process so that the insulator film 3 is located inside of the edges of the protective film 8 and covers the first wiring 1 in the cross portion.

Figure 4A:
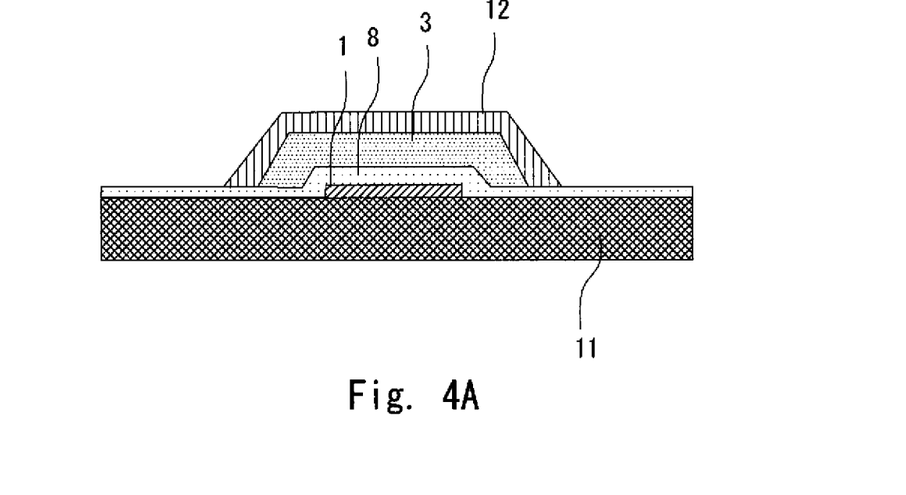
FIGS. 4A and 4B are diagrams each showing a manufacturing process of the semiconductor device according to the first exemplary embodiment.
Figure 4B:
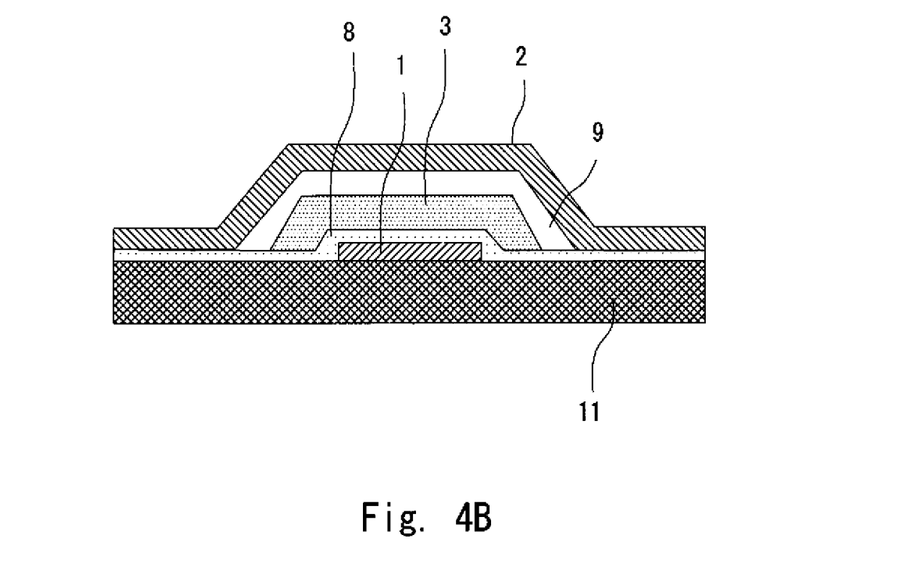

As shown in FIG. 4A, a resist 12 having a thickness of 2.5 um thickness is applied to protect the insulator film 3. The resist 12 is patterned into a desired profile by an exposure process and a development process. Next, a general manufacturing process of the air-bridge structure including a forming process of a voltage supply layer, a plate process, a milling process, and a removing process of the resist 12 are performed, thereby forming the cross portion including the second wiring 2 (See FIG. 4B).

Next, advantages of the semiconductor device according to the first exemplary embodiment of the present invention will be described. In the first exemplary embodiment, even if the second wiring 2 receives a mechanical external force in the case of forming the second wiring 2 or the like in the manufacturing process, the second wiring 2 is supported by the insulator film 3 located just under the second wiring 2. Therefore, it is ensured that the distance between the first wiring 1 and the second wiring 2 is not equal to or less than a minimum distance equivalent to the thickness of the insulator film 3. In the other words, it is ensured that a capacitance value of the parasitic capacitor made up of the first wiring 1, the insulator film 3, and the second wiring 2 is not equal to or more than a predetermined capacitance value. Because the insulator film 3 is formed on the upper surface and side surfaces of the first wiring 1 with a uniform thickness, the predetermined distance between the wirings can be ensured not only at the upper surface of the first wiring 1 but also at the side surfaces of the first wiring 1.

Here, the capacitance value between the wirings depends on the distance d between the electrodes. That is, when the second wiring 2 receives the external force, the capacitance value between the wirings depends on the thickness of the insulator film 3. However, when the thickness of the insulator film 3 is designed to be equal to or more than 0.5 um, the capacitance value can be sufficiently reduced. It is more preferred that the thickness of the insulator film 3 be equal to or more than 2.0 um to reduce the capacitance value to be equal to or less than 10 fF.

In the related art, one of factors causing deformation of the upper layered wiring is that the mechanical external force is applied during the manufacturing process under the condition that a wafer surface is in contact with a supporting member or the like. Therefore, in the related art, a deformation amount of the second wiring 2 varies to a large extent depending on a value of an external force applied during the manufacturing process. Because the capacitance value between the wirings is approximately in inverse proportion to the distance d between the wirings, the variation in the deformation amount of the second wiring 2 causes a variation in the capacitance between the wirings.

As a result, when the gate electrode and the source electrode cross each other as shown in the first exemplary embodiment, a variation occurs in a capacitance Cgs between the gate electrode and the source electrode, thereby causing a variation in a phase S11 of the transistor. On the other hand, when the drain electrode and the source electrode cross each other, a variation occurs in a capacitance Cds between the drain electrode and the source electrode, thereby causing a variation in a phase S22 of the transistor.

Figure 5:
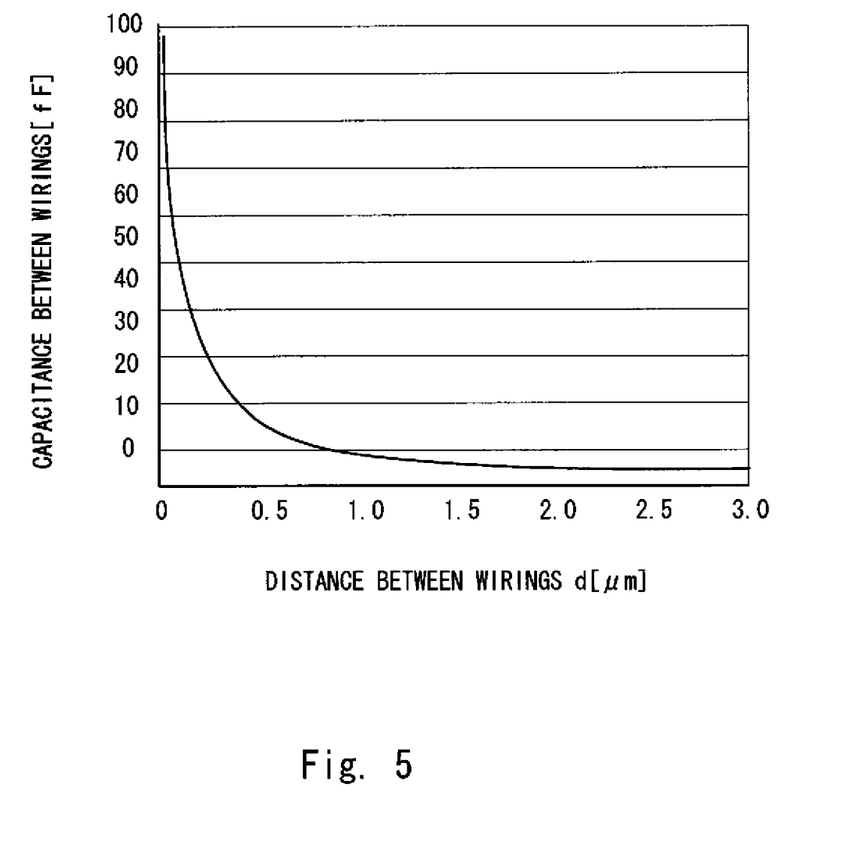
FIG. 5 is a diagram showing a relationship between a distance between wirings and a capacitance between wirings.

FIG. 5 shows a dependency characteristic of the capacitance between the wirings on the distance between the wirings. The distance d between the wirings is generally designed to be around 2 um. However, the distance d between the wirings may be around 0.1 um due to variation in manufacturing process. As a result, the capacitance value between the wirings increases by around 100 fF. This is equivalent to an increase of 30 angular degrees which is an amount of change in the phase S11 of the transistor at f=30 GHz. This is a main factor of the variation in the phase S11 of the transistor.

Figure 6:
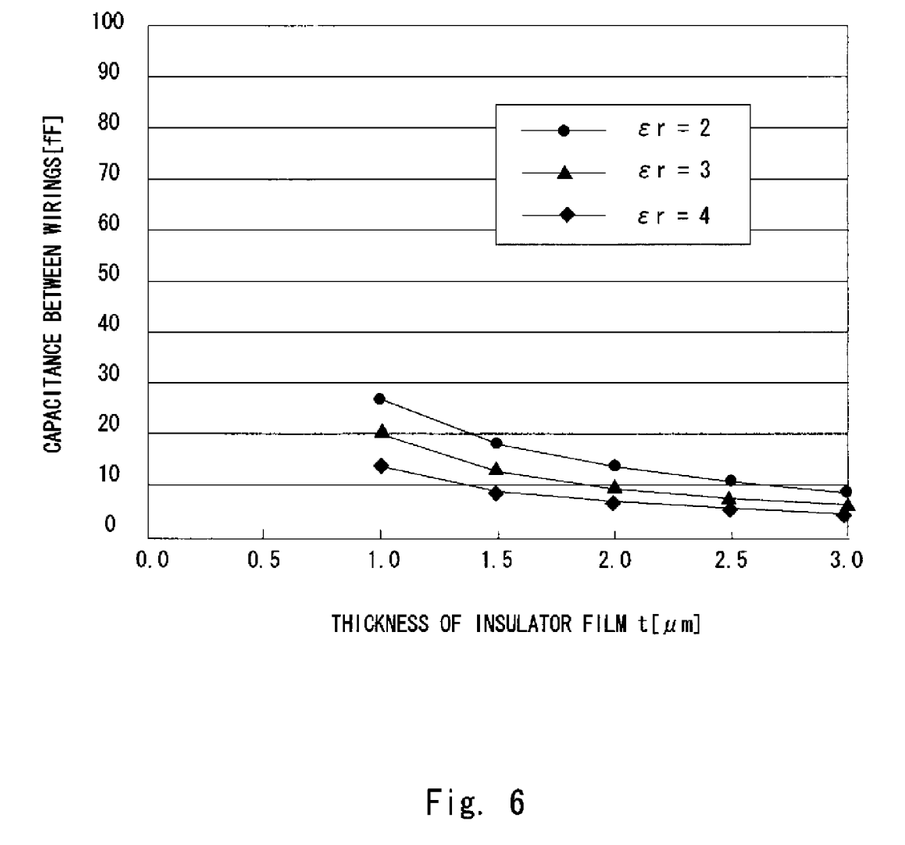
FIG. 6 is a diagram showing a relationship between a thickness of an insulator film and a capacitance between the wirings.

On the other hand, in this present exemplary embodiment, because the insulator film 3 is formed between the wirings, the capacitance between the wirings becomes larger. However, because the relative permittivity ∈r of the insulator film 3 is designed to be less than 3.0 and the thickness of the insulator film 3 is designed to be equal to or more than 1 um as shown in FIG. 6, an increase of the capacitance value can be reduced to be equal to or less than 20 fF. Further, if the thickness of the insulator film 3 is designed to be equal to or more than 2.0 um, the increase of the capacitance value can be reduced to be equal to or less than 10 fF. Furthermore, the relative permittivity ∈r of the insulator film 3 is designed to be equal to or less than 3.5, the capacitance value can be sufficiently reduced.

In the first exemplary embodiment, because the second wiring 2 is supported by the insulator film 3, the distance between the first wiring 1 and the second wiring 2 and the capacitance value between the wirings are constant. That is, as a result of that, the phases S11 and S22 of the transistor are also constant. Therefore, in the semiconductor device according to the first exemplary embodiment, because the distance between the wirings is ensured, the factor of the variation can be eliminated and the variations in the phases S11 and S12 can be substantially reduced.

Figure 7A:
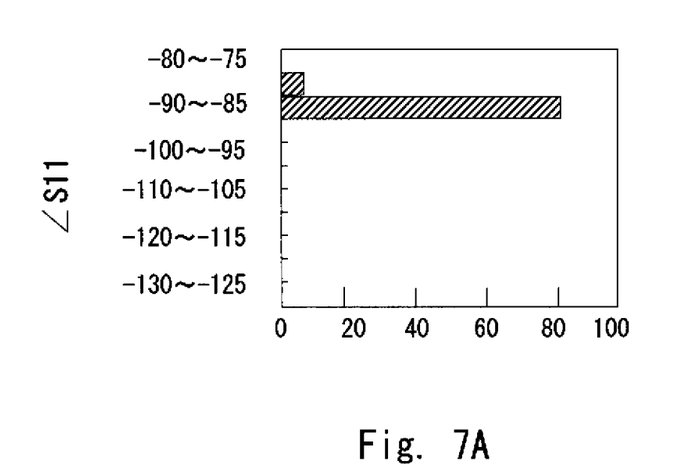
FIG. 7A is a diagram showing a distribution of a phase S11 at f=30 GHz in the transistor of the present invention.
Figure 7B:
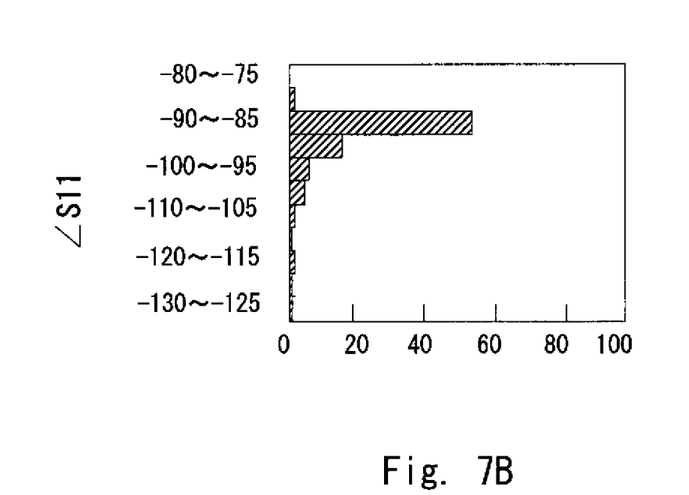
FIG. 7B a diagram showing a distribution of the phase S11 at f=30 GHz in the transistor of the related art.

FIG. 7A shows a distribution of the phase S11 of the transistor at f=30 GHz in the first exemplary embodiment and FIG. 7B shows that of the transistor in the related art. The increase of the capacitance value of the wiring portion appears not as an increase in the capacitance of the transistor portion 15 but as an increase in the capacitance in an external area of the transistor portion 15. That is, the increase of the capacitance value causes only a change in parameters of a matching circuit necessary for impedance matching but does not causes any deterioration in characteristics of an amplifier.

Further, in the semiconductor device according to the exemplary embodiment, because the insulator film 3 is formed in an inner side of the protective film 8 under the second wiring 2 in the cross portion, the first wiring 1 can be protected by the protective film 3 when the insulator film 3 is patterned along the outline of the first wiring 1. This prevents the first wiring 1 from being damaged and improves the yield ratio of the product.

Further, in the semiconductor device disclosed in Japanese Unexamined Patent Application Publication No. 10-12722, the insulator film is formed of $SiO_2$ or $Si_3N_4$. Here, $SiO_2$ and $Si_3N_4$ are generally deposited with a predetermined thickness over the wafer by CVD and the insulator film having the same thickness is formed on the transistor portion 15. Therefore, when the insulator film on the transistor portion 15 is removed so that the insulator film is left only on the first wiring of the lower layered wiring, dry etching or the like is used for removing the insulator film, thereby damaging the transistor portion 15.

On the other hand, in the semiconductor device according to the present first exemplary embodiment, because the insulator film 3 is formed of the insulating material which has a photosensitivity and is formed by spin-coating process, no etching process is required at the time of patterning process of the insulator film 3, thereby preventing the transistor portion 15 from being damaged. Therefore, the yield ratio of the product can be improved.

In the first exemplary embodiment, a positional relationship between the source electrode and the gate electrode in the cross portion can be reversed. That is, a configuration may be applied in which the source electrode is designed as the lower layered wiring and the gate electrode is designed as the upper layered wiring.

Second Exemplary Embodiment

Figure 8:
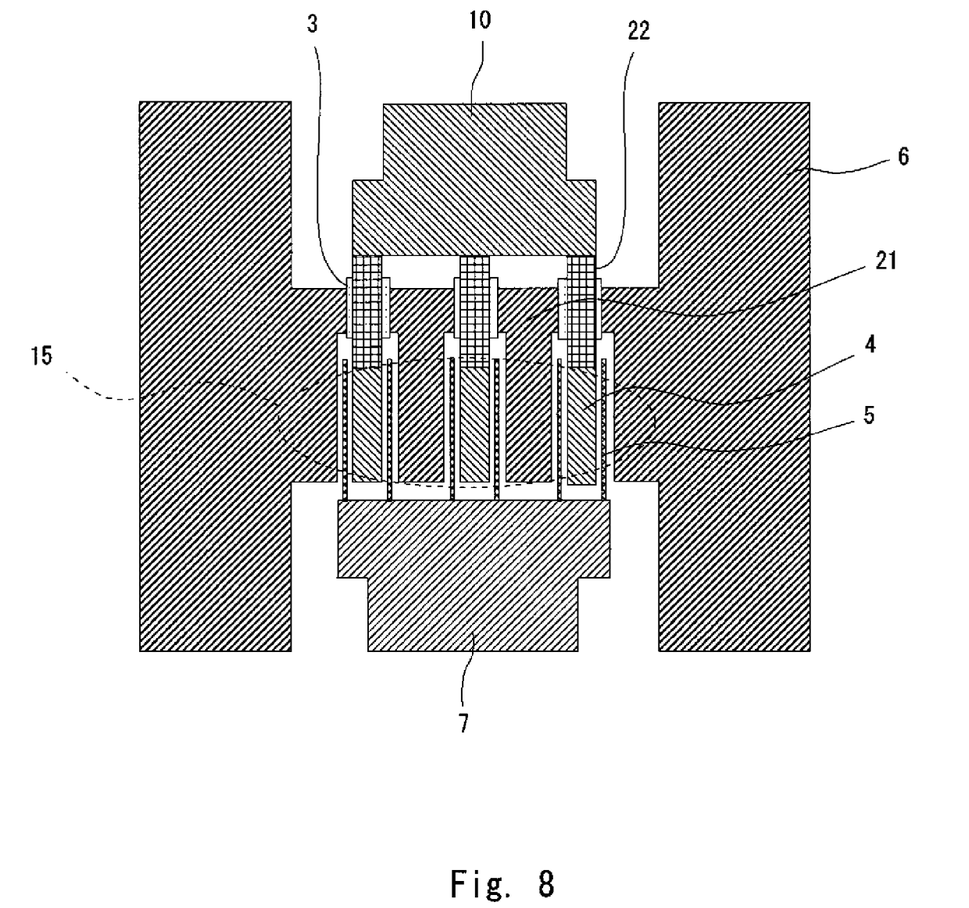
FIG. 8 is a plan view showing an exemplary configuration of a semiconductor device according to a second exemplary embodiment of the present invention.

Referring next to FIG. 8, a semiconductor device according to as a second exemplary embodiment of the present invention will be described. FIG. 8 is a plan view showing a configuration around the transistor portion 15 of the semiconductor device according to the second exemplary embodiment of the present invention. In the second exemplary embodiment, the drain electrode is formed as a first wiring 21 of a lower layered wiring and the source electrode is formed as a second wiring 22 of the upper layered wiring.

In an inside of a cross portion in which the first wiring 21 and the second wiring 22 cross each other, the first wiring 21 is covered by the protective film 8 (for example, which is made of a SiN film) of the transistor portion 15. The first wiring 21 is also covered by the insulator film 3. For example, the insulator film 3 may be formed of a BCB film serving as a the low dielectric film having the relative permittivity ∈r of approximately 2.7.

For example, a thickness of the insulator film 3 is designed to be 2.0 um. The insulator film 3 covers the first wiring 21 and extends outwardly about several um from the cross portion, and is not applied to the transistor portion 15.

A manufacturing method and advantages of the second exemplary embodiment are almost the same as the first exemplary embodiment and an explanation thereof is omitted. Further, a configuration may be applied to the second exemplary embodiment in which the source electrode is formed of the first wiring which is the lower layered wiring and the drain electrode is formed of the second wiring which is the upper layered wiring.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device comprising:
    a semiconductor substrate;
    a first wiring on the semiconductor substrate;
    a second wiring that crosses the first wiring at a cross portion;
    a protective film on the semiconductor substrate covering at least a part of the first wiring under the second wiring in the cross portion;
    an insulator film in an island shape on the protective film under the second wiring in the cross portion between edges of the protective film and covering the first wiring in the cross portion; and
    a gas-filled space between said insulator film and said second wiring in the cross portion,
    wherein the second wiring crosses an edge of the insulator film and contacts an upper surface of the protective film.

2. The semiconductor device according to claim 1, wherein the insulator film is formed of a material formed by a spin-coating process or a printing process.

3. The semiconductor device according to claim 1, wherein the insulator film is formed on an upper surface and a side surface of the first wiring with a uniform thickness.

4. The semiconductor device according to claim 1, wherein an edge of the insulator film is located outside of an edge of the first wiring.

5. The semiconductor device according to claim 1, wherein the insulator film is thicker than the protective film.

6. The semiconductor device according to claim 1, wherein the insulator film has a thickness equal to or more than 0.5 um.

7. The semiconductor device according to claim 1, wherein the protective film has a thickness equal to or less than 0.2 um.

8. The semiconductor device according to claim 1, wherein a distance between the first wiring and the second wiring in the cross portion is equal to or more than 1.0 um.

9. The semiconductor device according to claim 1, wherein one of the first wiring and the second wiring is a gate electrode and the other is a source electrode.

10. The semiconductor device according to claim 1, wherein one of the first wiring and the second wiring is a drain electrode and other is a source electrode.

11. The semiconductor device according to claim 1, wherein the insulator film has a relative permittivity of 3.5 or less.

12. The semiconductor device according to claim 1, wherein the protective film is outside of the cross portion.

13. A manufacturing method of a semiconductor device comprising:
    forming a first wiring on a semiconductor substrate;
    forming a second wiring to cross the first wiring with a gas-filled space interposed therebetween at a cross portion in which the first wiring and the second wiring cross each other;
    forming a protective film on the semiconductor substrate to cover at least a part of the first wiring, the part being located under the second wiring in the cross portion; and
    forming an insulator film in an island shape on the protective film under the second wiring in the cross portion between edges of the protective film, the insulator film covering the first wiring in the cross portion and leaving a portion of said gas-filled space between said insulator film and said second wiring,
    wherein the second wiring crosses an edge of the insulator film and contacts an upper surface of the protective film.

14. The manufacturing method of the semiconductor device according to claim 13, wherein the forming the insulator film is performed by a spin-coating process or a printing process.

15. The manufacturing method of the semiconductor device according to claim 13, wherein the forming the insulator film is performed by exposing and developing an insulator material having photosensitivity.

16. The manufacturing method of the semiconductor device according to claim 13, wherein an edge of the insulator film is located outside an edge of the first wiring.

17. The manufacturing method of the semiconductor device according to claim 13, wherein the insulator film is thicker than the protective film.

18. The manufacturing method of the semiconductor device according to claim 13, wherein the insulator film has a thickness equal to or more than 0.5 um.

19. The manufacturing method of the semiconductor device according to claim 13, wherein the protective film has a thickness equal to or less than 0.2 um.

20. The manufacturing method of the semiconductor device according to claim 13, wherein a distance between the first wiring and the second wiring in the cross portion is more equal to or more than 1.0 um.

21. The manufacturing method of the semiconductor device according to claim 13, wherein one of the first wiring and the second wiring is a gate electrode and the other is a source electrode.

22. The manufacturing method of the semiconductor device according to claim 13, wherein one of the first wiring and the second wiring is a drain electrode and the other is a source electrode.

23. The manufacturing method of the semiconductor device according to claim 13, wherein the insulator film has a relative permittivity of 3.5 or less.

\* \* \* \* \*